US011285609B2

(12) United States Patent
Fujita et al.

(10) Patent No.: US 11,285,609 B2
(45) Date of Patent: Mar. 29, 2022

(54) WORKING POSITION CORRECTING METHOD AND WORKING ROBOT

(71) Applicant: FUJI CORPORATION, Chiryu (JP)

(72) Inventors: Masatoshi Fujita, Anjyo (JP); Masato Suzuki, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 234 days.

(21) Appl. No.: 16/341,242

(22) PCT Filed: Nov. 17, 2016

(86) PCT No.: PCT/JP2016/084121
§ 371 (c)(1),
(2) Date: Apr. 11, 2019

(87) PCT Pub. No.: WO2018/092243
PCT Pub. Date: May 24, 2018

(65) Prior Publication Data
US 2019/0255708 A1    Aug. 22, 2019

(51) Int. Cl.
*B25J 9/16* (2006.01)
*H05K 13/08* (2006.01)
(Continued)

(52) U.S. Cl.
CPC ............. *B25J 9/1692* (2013.01); *B25J 9/10* (2013.01); *B25J 9/1638* (2013.01); *B25J 9/1664* (2013.01);
(Continued)

(58) Field of Classification Search
CPC ........ B25J 9/1692; B25J 13/08; B25J 9/1638; B25J 9/1697; B25J 9/10; B25J 9/1664;
(Continued)

(56) References Cited

U.S. PATENT DOCUMENTS 6,304,050 B1 * 10/2001 Skaar .................... B25J 9/1692
318/568.11
8,680,806 B2    3/2014 Mori
(Continued)

FOREIGN PATENT DOCUMENTS

JP    60-205713 A    10/1985
JP    61-90205 A     5/1986
(Continued)

OTHER PUBLICATIONS

International Search Report dated Feb. 7, 2017 in PCT/JP2016/084121 filed on Nov. 17, 2016.
(Continued)

*Primary Examiner* — Abby Y Lin
*Assistant Examiner* — Dylan M Katz
(74) *Attorney, Agent, or Firm* — Oblon, McClelland, Maier & Neustadt, L.L.P.

(57) ABSTRACT

A work robot includes a multi-joint type robot arm and an actuator configured to drive each joint of the robot arm, and corrects a designated target position by a correction parameter to operate the robot arm. The correction of the target position is performed by setting multiple work points in a movable area of the robot, setting a correction parameter in which a spatial coordinate value and a correction value are associated with respect to the set multiple work points, and reflecting the set correction parameter on the target position.

12 Claims, 10 Drawing Sheets

(51) Int. Cl.
*B25J 13/08* (2006.01)
*B25J 9/10* (2006.01)

(52) U.S. Cl.
CPC ............ *B25J 9/1697* (2013.01); *B25J 13/08* (2013.01); *H05K 13/089* (2018.08); *B25J 9/1653* (2013.01)

(58) Field of Classification Search
CPC ............... B25J 19/023; H05K 13/089; G05B 2219/45063; G05B 2219/50057; G05B 2219/39056; G05B 2219/33078; G05B 2219/39045; B23Q 17/22
See application file for complete search history.

(56) References Cited

U.S. PATENT DOCUMENTS

| | | | | |
|---|---|---|---|---|
| 2011/0066393 | A1* | 3/2011 | Groll | B25J 9/1676 702/94 |
| 2014/0100694 | A1* | 4/2014 | Rueckl | B25J 9/1692 700/254 |
| 2014/0229005 | A1* | 8/2014 | Suzuki | B25J 9/1697 700/254 |
| 2016/0059417 | A1* | 3/2016 | Shirakyan | B25J 9/1694 700/251 |
| 2016/0059419 | A1* | 3/2016 | Suzuki | B25J 9/1697 700/114 |
| 2017/0072566 | A1* | 3/2017 | Murata | B25J 9/1692 |

FOREIGN PATENT DOCUMENTS

| | | |
|---|---|---|
| JP | 2009-148850 A | 7/2009 |
| JP | 2011-173234 A | 9/2011 |

OTHER PUBLICATIONS

Ginani, L. S., et al., "Theoretical and Practical Aspects of Robot Calibration with Experimental Verification", Database Compendex [Online] Engineering Information, Inc., New York, NY, US: 2011. Database accession No. E20112013981522 : & Journal of the Brazilian Society of Mechanical Sciences and Engineering 2011 Springer Verlag Bra, vol. 33, No. 1, 2011, pp. 15-21, DOI: 10.1590/S1678-58782011000100003.

* cited by examiner

WORKING POSITION CORRECTING METHOD AND WORKING ROBOT

TECHNICAL FIELD

The present specification discloses a work position correction method and a work robot.

BACKGROUND ART

In a related art, as the type of the work robot, there has been proposed a work robot in which an operation of a robot is controlled by applying a DH parameter to a target point and performing a coordinate transformation (see Patent Literature 1, for example). Setting of the DH parameter is performed as follows. That is, a control device of the robot sets a measurement point in an operation space of the robot. Next, the control device moves the robot to the measurement point to acquire three-dimensional position data. Then, the control device derives the DH parameter from an error between the acquired position data and the measurement point. At a time of controlling the operation of the robot based on the target point, the control device applies the DH parameter to the target point to perform the coordinate transformation.

PATENT LITERATURE

Patent Literature 1: JP-A-No. 2009-148850

BRIEF SUMMARY

Technical Problem

However, in the above described work robot, even in a case where the DH parameter used for the coordinate transformation is optimized, a sufficient work precision may not be secured. For example, in a case where an error (for example, distortion of an arm) that cannot be corrected by an optimization of the DH parameter is included, the work robot cannot move to an accurate position due to an influence of the error.

It is a main object of the present disclosure to secure a work precision necessary for operating a work robot by designating a target position.

Solution to Problem

The present disclosure employs following means in order to achieve the above described main object.

The work position correction method of the present disclosure is a work position correction method for operating a multi-joint type work robot by designating a target position, the method including: setting multiple work points in a movable area of the work robot; setting a correction parameter in which a spatial coordinate value and a correction value are associated with respect to the set multiple work points; and reflecting the set correction parameter on the target position.

In the work position correction method of the present disclosure, first, the multiple work points are set in the movable area of the work robot. Next, in the work position correction method, a correction parameter is set such that the spatial coordinate value and the correction value are associated with respect to the set multiple work points. Then, in the work position correction method, the set correction parameter is reflected on the target position. Accordingly, even in a case where an error is included in a robot arm, the work robot can move to the target position more accurately without being affected by the error. As a result, according to the present disclosure, a sufficient work precision can be secured for operating the work robot by designating the target position.

A work robot of the present disclosure includes: a multi joint type robot arm; an actuator configured to drive each joint of the robot arm; a storage device configured to store a correction parameter in which a spatial coordinate value and a correction value are respectively associated with respect to multiple work points arranged in a matrix in a movable area of the robot arm; and a control device configured to correct a target position using the correction parameter stored in the storage device and to control the actuator based on the corrected target position.

The work robot of the present disclosure includes the robot arm, the actuator, the storage device, and the control device. The storage device stores the correction parameter in which the spatial coordinate value and the correction value are respectively associated with respect to the multiple work points arranged in a matrix in the movable area of the robot arm. The control device corrects the target position using the correction parameter stored in the storage device, and controls the actuator based on the corrected target position. Accordingly, even in a case where the error is included in the robot arm, the work robot can move the robot arm to the target position more accurately without being affected by the error. As a result, according to the present disclosure, it is possible to secure the work precision required for the operation of the work robot by designating the target position.

DESCRIPTION OF EMBODIMENTS

Next, embodiments of the present disclosure will be described with reference to the drawings.

Figure 1:
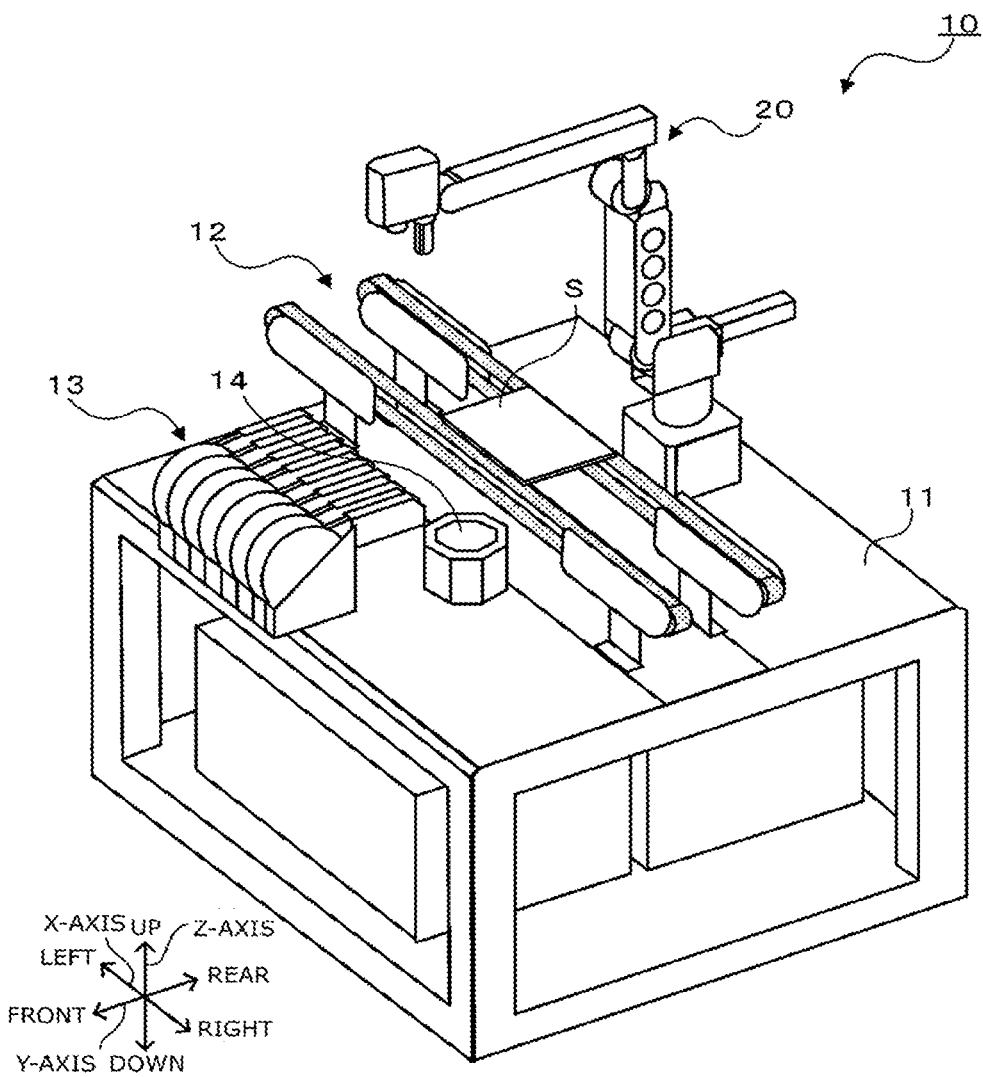
FIG. 1 is a configuration diagram illustrating an outline of a configuration of robot system 10.
Figure 2:
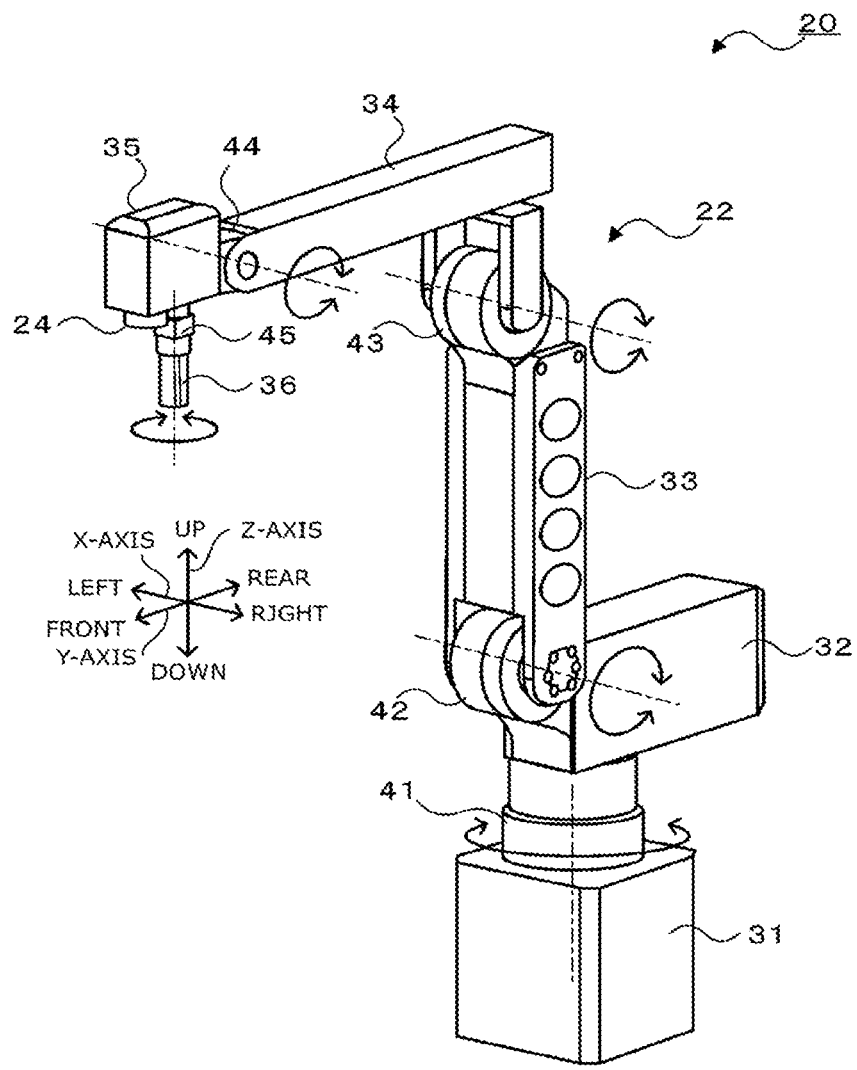
FIG. 2 is a configuration diagram illustrating an outline of a configuration of robot 20.
Figure 3:
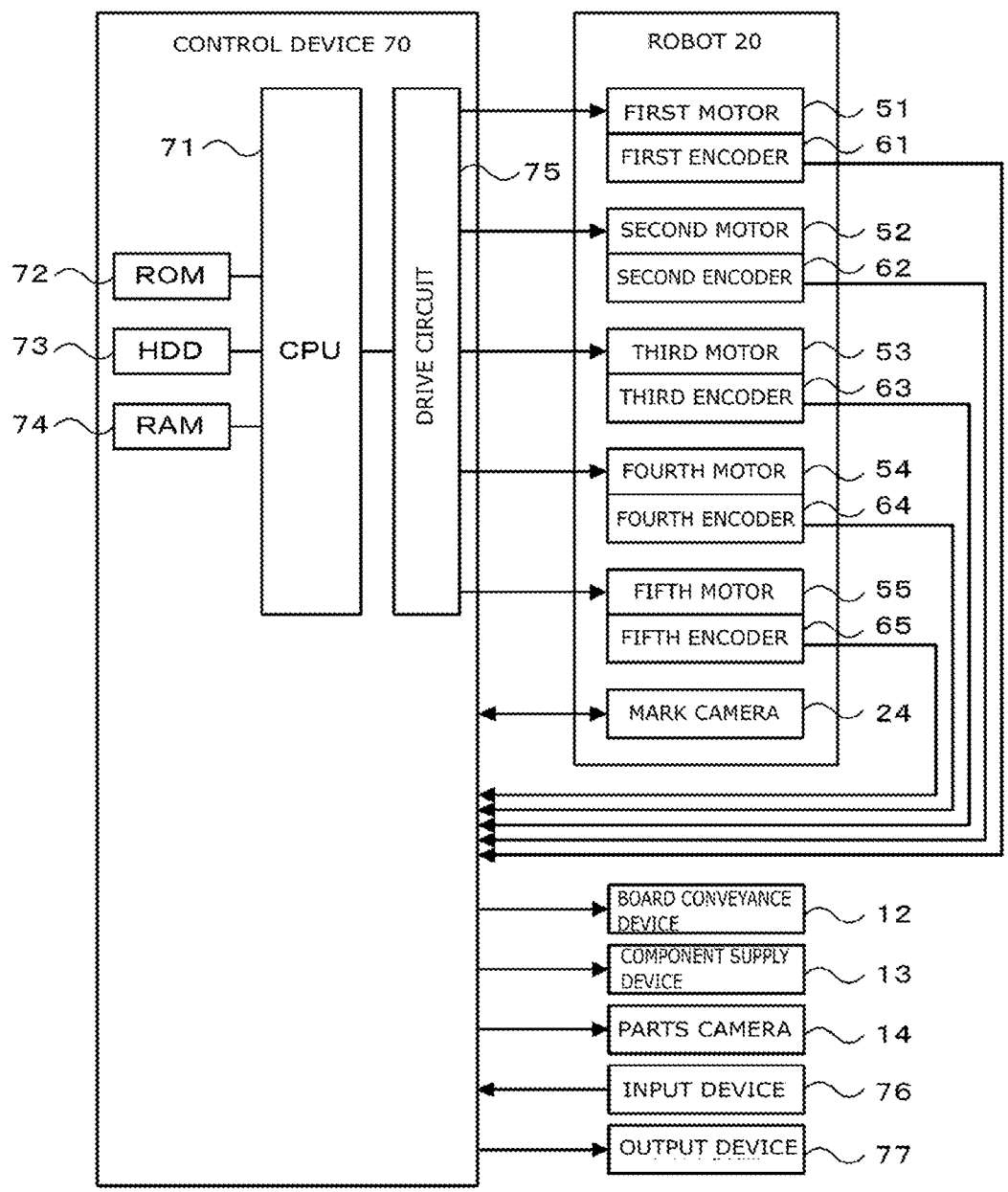
FIG. 3 is a block diagram illustrating an electrical connection relation between robot 20 and control device 70.

FIG. 1 is a configuration diagram illustrating an outline of a configuration of robot system 10. FIG. 2 is a configuration diagram illustrating an outline of a configuration of robot 20. FIG. 3 is a block diagram illustrating an electrical connection relation between robot 20 and control device 70. In FIGS. 1 and 2, a front-rear direction is an X-axis direction, a right-left direction is a Y-axis direction, and an up-down direction is a Z-axis direction.

Robot system 10 includes robot 20 and control device 70 configured to control robot 20. Robot system 10 is configured as a system to pick up a workpiece and place the picked up workpiece on an object. In the present embodiment, robot system 10 is configured as a component mounting system to pick up a component and mounts the component on board S. The robot system is not limited to the above described system, and can be applied to any system as long as the system is configured to perform a work on the workpiece using robot 20.

Robot 20 includes five-axis vertical multiple joint arm (hereinafter referred to as an arm) 22 and an end effector (not illustrated) which is a tip of robot 20. Arm 22 includes six links (first to sixth links 31 to 36) and five joints (first to fifth joints 41 to 45) configured to rotatably or pivotably connecting each link. Each joint (first to fifth joints 41 to 45) includes a motor (first to fifth motors 51 to 55) configured to drive the corresponding joint, and an encoder (first to fifth encoders 61 to 65) configured to detect a rotation angle of the corresponding motor. In the present embodiment, the motor is a servo motor and the encoder is a rotary encoder. The end effector is attached to a distal link (sixth link 36) of arm 22 and is capable of holding and releasing a component (workpiece). As the end effector, for example, a mechanical chuck, a suction nozzle, and an electromagnet can be used. Further, mark camera 24, which is configured to image mark M attached to an object such as a work object put on workbench 11, is attached to arm 22 (fifth link 35).

A proximal link (first link 31) of arm 22 is fixed to workbench 11. On workbench 11, board conveyance device 12, component supply device 13, parts camera 14, and the like are disposed. In the present embodiment, board conveyance device 12 has a pair of belt conveyors spanned in the right-left direction (X-axis direction) at intervals in the front-rear direction (Y-axis direction). Board S is conveyed from the left to the right by the belt conveyor. In the present embodiment, the component supply device 13 is configured as a tape feeder to feed a tape, in which multiple components are accommodated at predetermined intervals, rearward (in the Y-axis direction). Component supply device 13 is not limited to the tape feeder, and may be any type of component supply device such as a tray feeder configured to supply a tray in which the multiple components are disposed. Parts camera 14 images a component held by the end effector when the component passes over the parts camera 14, and outputs the captured image to control device 70.

Control device 70 is configured as a microprocessor in which CPU 71 is a main section, and includes ROM 72, HDD 73, RAM 74, drive circuit 75, and the like in addition to CPU 71. Drive circuit 75 is a circuit configured to drive first to fifth motors 51 to 55. Signals are input to control device 70 from first to fifth encoders 61 to 65, parts camera 14, mark camera 24, input device 76, and the like. Control device 70 outputs signals to board conveyance device 12, component supply device 13, output device 77, and first to fifth motors 51 to 55. Input device 76 is an input device through which an operator performs an input operation. Further, output device 77 is a display device configured to display various types of information.

Figure 4:
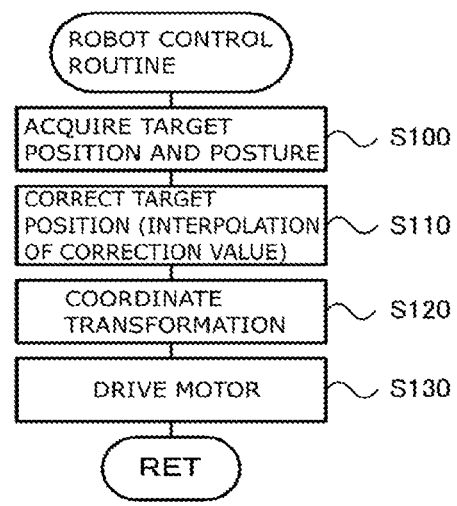
FIG. 4 is a flowchart illustrating an example of a robot control routine.

FIG. 4 is a flowchart illustrating an example of a robot control routine executed by control device 70. The routine is repeatedly executed at every predetermined time intervals. When the robot control routine is executed, CPU 71 of control device 70 first acquires a target position and a posture (S100). Here in the present embodiment, in a case where the pick up work is performed, the target position and the posture are the position and the posture of the end effector at the time of picking up the component. Further, in a case where a mounting work is executed, the target position and the posture are the position and the posture of the end effector at the time of mounting the picked up component on board S.

Figure 5:
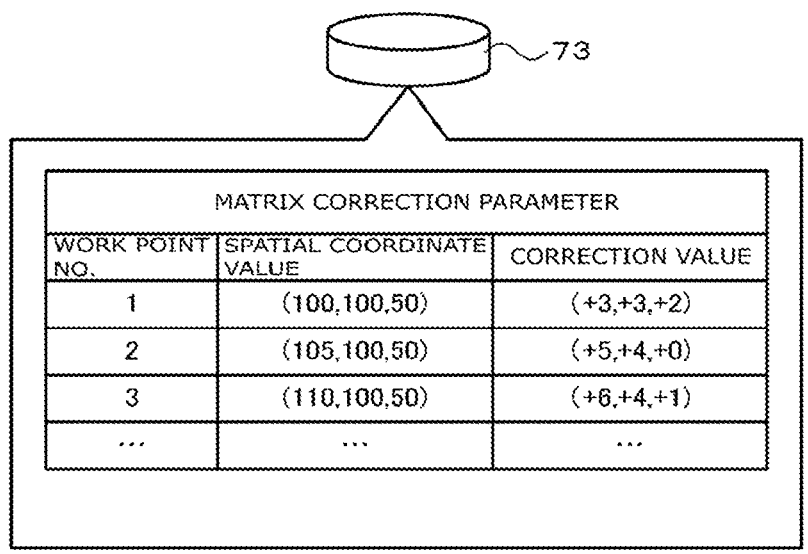
FIG. 5 is an explanatory diagram illustrating an example of a matrix correction parameter.

Next, CPU 71 corrects the acquired target position using a matrix correction parameter (S110). FIG. 5 is an explanatory diagram illustrating an example of the matrix correction parameter. As illustrated in the drawings, in the matrix correction parameter, identification information of a work point (work point number), a spatial coordinate value, and a correction value (three-dimensional offset amount) are associated with each other, and the matrix correction parameter is stored in HDD 73. The correction of the target position can be performed by deriving the correction value at the target position from the correction values of multiple work points around the target position using a conventional interpolation method such as a linear interpolation, and offsetting the target position with the derived correction value. Alternatively, the correction of the target position may be performed by offsetting the target position with the correction value of the work point closest to the target position.

Subsequently, CPU 71 sets a target angle of each joint (first to fifth joints 41 to 45) by a coordinate transformation of the corrected target position and the posture (S120). The coordinate transformation can be performed using, for example, a well-known DH parameter.

Then, CPU 71 drives and controls the corresponding motor (first motors 51 to 55) based on the set target angle (S130), and ends the robot control routine. Further, CPU 71 causes the end effector to hold the component to be picked up when the end effector reaches the target position and the posture in a case where the pick up work is executed. Further, CPU 71 causes the end effector to release the component to be mounted on board S when the end effector reaches the target position and the posture in a case where the mounting work is executed.

Figure 6:
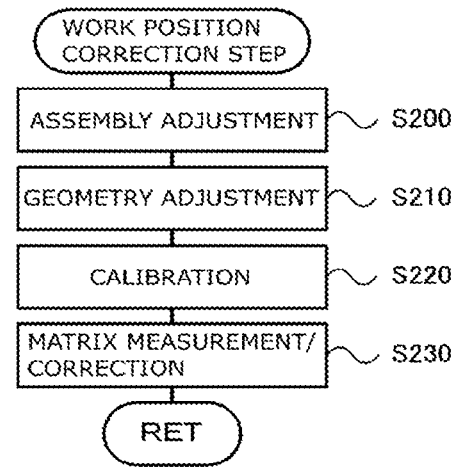
FIG. 6 is an explanatory diagram illustrating an example of a work position correction step.

The following description describes a work position correction step at the time of controlling the operation of robot 20 using the target position. FIG. 6 is an explanatory diagram illustrating an example of the work position correction step. The work position correction step is performed by executing an assembly adjustment (S200), a geometry adjustment (S210), a calibration (S220), and a matrix measurement/correction (S230) in order. For convenience of description, the description will be made in order of the matrix measurement/correction, the assembly adjustment, the geometry adjustment, and the calibration.

Figure 7:
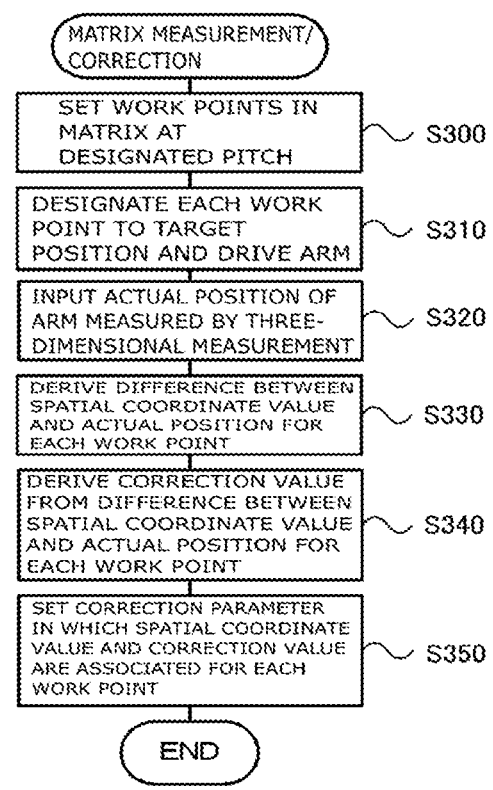
FIG. 7 is an explanatory diagram illustrating an example of a measurement procedure of a matrix measurement/correction.
Figure 8:
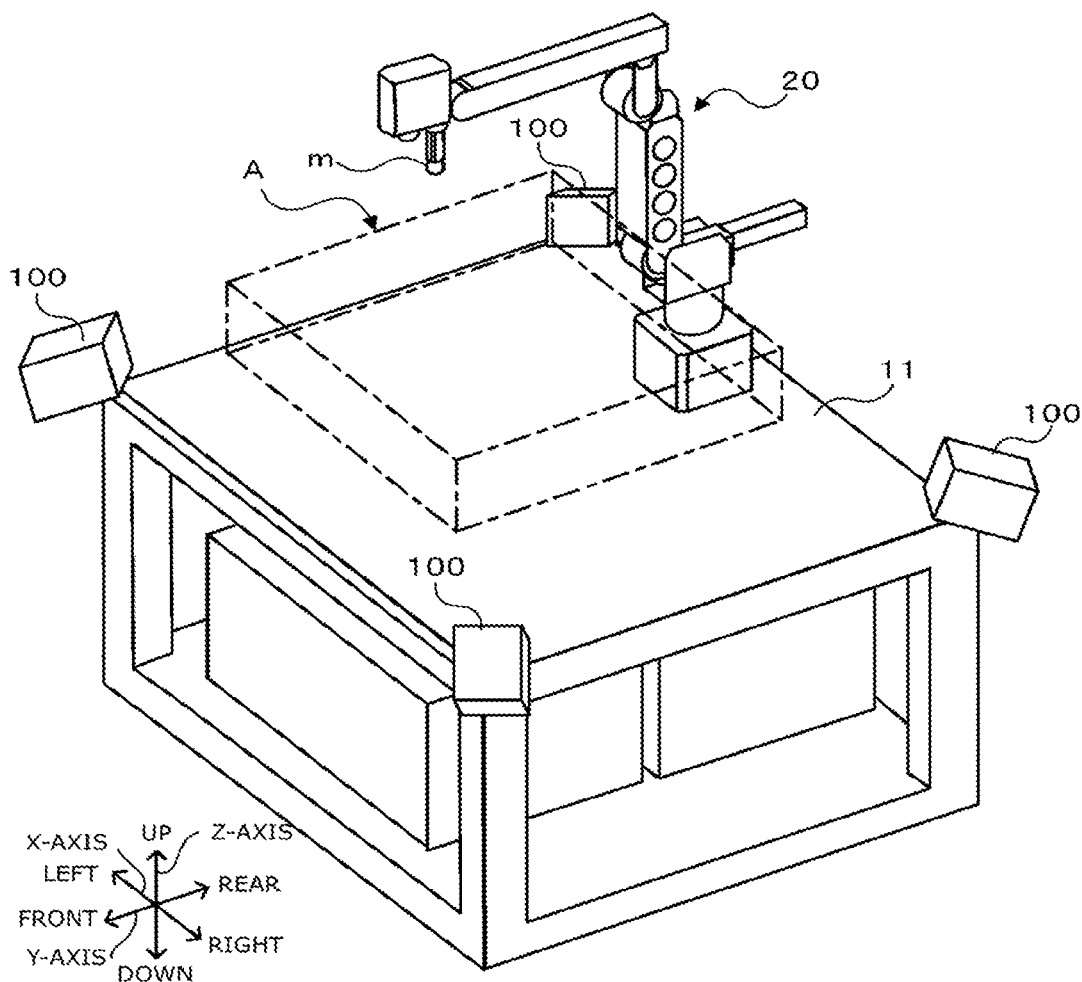
FIG. 8 is an explanatory diagram illustrating a state in which a three-dimensional measurement is performed on marker m using three-dimensional measurement instrument 100.
Figure 9:
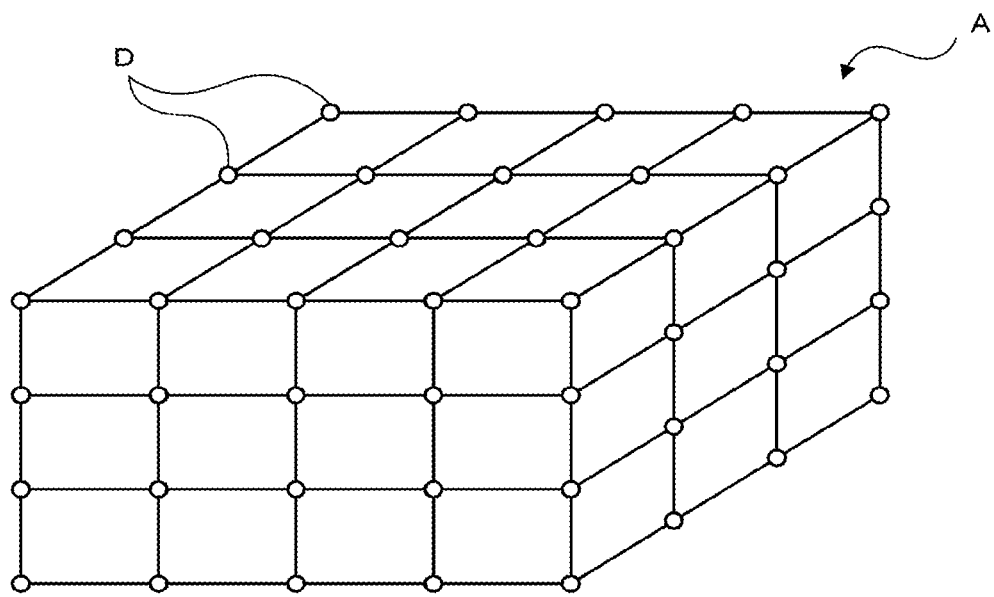
FIG. 9 is an explanatory diagram illustrating an example of a work point.

The matrix measurement/correction is a step of setting the matrix correction parameter used for the correction of the above described target position. FIG. 7 is an explanatory diagram illustrating an example of the matrix measurement/correction. The matrix measurement corresponds to S300 to S330 of FIG. 7. The matrix correction includes S340 and S350 of FIG. 7, and S110 of FIG. 4. Further, FIG. 8 is an explanatory diagram illustrating a state in which a three-dimensional measurement is performed on marker m using three-dimensional measurement instrument 100. In FIG. 8, area A is a work area of robot 20. In preparation for the matrix measurement, the operator attaches the measurement marker m to the distal link, and installs three-dimensional measurement instrument 100 at each corner of workbench 11, as illustrated in FIG. 8. Three-dimensional measurement instrument 100 can use a laser tracker or a motion capture. When an instruction of the matrix measurement/correction is provided, CPU 71 of control device 70 first sets the multiple work points in a matrix at a designated pitch in work area A of robot 20 (S300). FIG. 9 is an explanatory diagram illustrating an example of the work point. The pitch is designated by the operator in manner of manipulating input device 76. Subsequently, CPU 71 designates the spatial coordinate value of each work point to the target position, and controls arm 22 (first to fifth motors 51 to 55) such that to marker m moves to the designated target position (S310). Then, control device 70 inputs an actual position of marker m measured by three-dimensional measurement instrument 100 (S320). Next, CPU 71 derives a difference between the spatial coordinate value and the input actual position of marker m for each work point (S330). As the matrix measurement is performed in such a manner, CPU 71 derives the correction value (offset value) from the derived difference (S340). Then, CPU 71 sets the matrix correction parameter in which the spatial coordinate value and the correction value are associated for each work point (S350), and ends the matrix measurement/correction.

The assembly adjustment is a step of adjusting an assembly angle or the like by using a jig for assembling each link (first to sixth links 31 to 36).

The geometry adjustment is a step of optimizing the DH parameter used for the coordinate transformation. In preparation for the geometry adjustment, the operator attaches the measurement marker m to the distal link and installs three-dimensional measurement instrument 100 at each corner of workbench 11, similar to the matrix measurement/correction. When an instruction of the geometry adjustment is provided, CPU 71 sets the multiple measurement points in work area A of robot 20. The measurement point can be set, for example, by the operator manipulating input device 76 to designate the measurement point. Next, CPU 71 designates the spatial coordinate value of each measurement point to the target position, and controls arm 22 (first to fifth motors 51 to 55) such that the marker m moves to the designated target position. Then, CPU 71 inputs the actual position of the marker m measured by three-dimensional measurement instrument 100, and makes an inverse calculating operation of the DH parameter such that the difference (error) between the spatial coordinate value of the measurement point and the input actual position of the marker m comes to be minimized, thereby ending the geometry adjustment.

Figure 10:
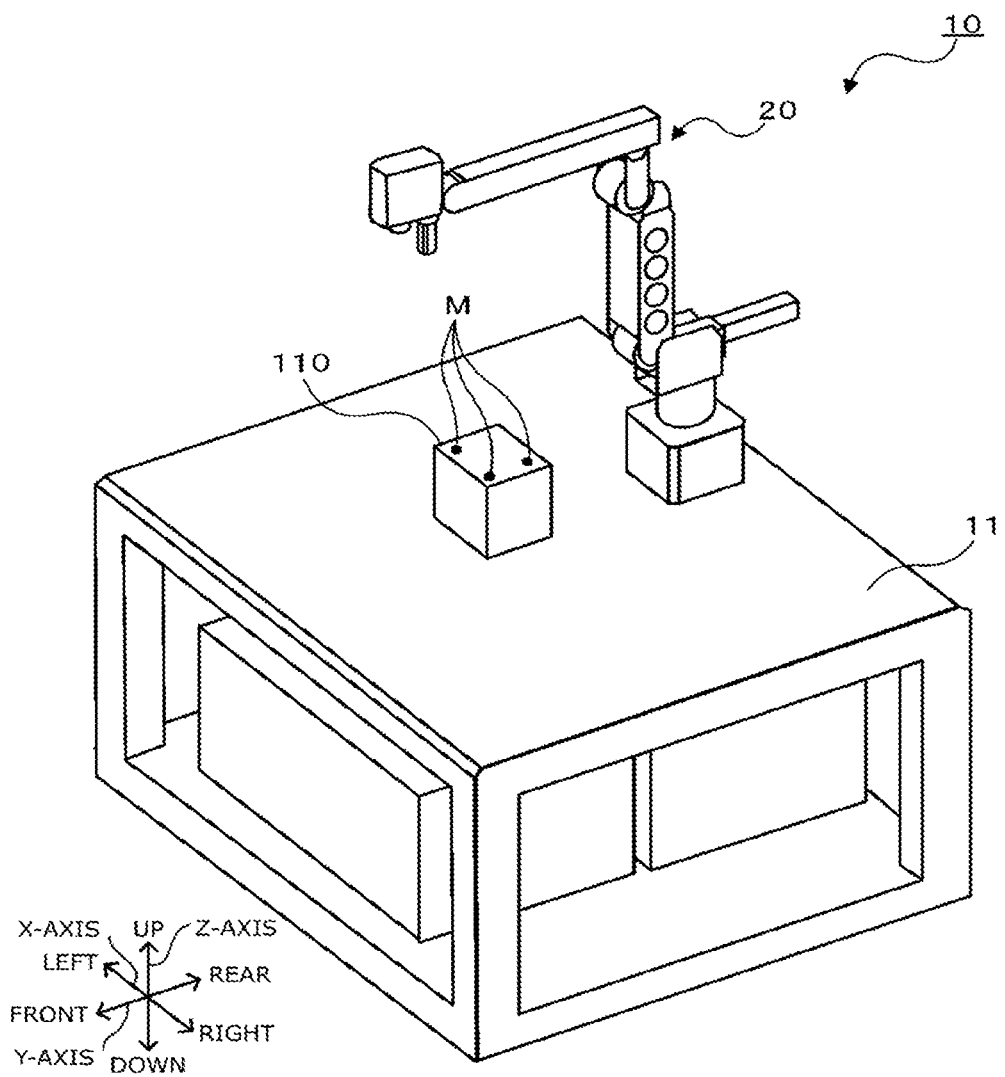
FIG. 10 is an explanatory diagram illustrating a state of a calibration.

The calibration is a step of grasping a relative positional relation between robot 20 and workbench 11 (work object), and reflecting the relative positional relation on the target position at the time of operating robot 20. FIG. 10 is an explanatory diagram illustrating a state of the calibration. In preparation for the calibration, the operator fixes object 110 to which mark M is attached in a predetermined position on workbench 11. When an instruction of the calibration is provided, CPU 71 first controls arm 22 (first to fifth motors 51 to 55) such that mark camera 24 moves above object 110. Subsequently, CPU 71 images mark M attached to object 110 by mark camera 24. Then, CPU 71 performs the coordinate transformation of the rotation angle of each joint detected by the encoder (first to fifth encoders 61 to 65), and calculates the position (imaging position) of mark camera 24 at the time of the imaging. Next, CPU 71 recognizes the position of the mark M in the captured image based on the calculated imaging position. Then, CPU 71 specifies the relative positional relation between robot 20 and workbench 11 from the recognized position of the mark M, reflects the relative positional relation on the target position at the time of operating robot 20, and ends the calibration.

As described above, in the present embodiment, the matrix measurement/correction is executed after the geometry adjustment and the calibration are executed. That is, the matrix measurement/correction is executed in a state in which a positional precision of robot 20 is enhanced to some extent by the execution of the geometry adjustment and the calibration. Here, the finer the pitch between the work points designated in the matrix measurement/correction, the higher the correction precision of the matrix correction parameter derived in the matrix measurement/correction. However, in this case, matrix measurement/correction requires a long time to execute. Further, as for the matrix correction parameter, the number of data increases, which causes the necessary storage capacity to increase. In the present embodiment, by executing the geometry adjustment and the calibration before the matrix measurement/correction, it is possible to obtain the correction value with the precision necessary in an entire work area without excessively finely setting the pitch.

Here, the corresponding relation between the main elements of the present embodiment and the main elements of the disclosure will be described. That is, arm 22 (first to sixth links 31 to 36) corresponds to a robot arm, the motor (first to fifth motors 51 to 55) corresponds to an actuator, HDD 73 corresponds to a storage device, and control device 70 corresponds to a control device.

In the present embodiment described above, the multiple work points are set in the movable area of robot 20, and the matrix measurement/correction is performed to set the matrix correction parameter in which the spatial coordinate value and the correction value are associated with respect to the set multiple work points. Control device 70 of robot 20 corrects the designated target position using the matrix correction parameter. Accordingly, even in a case where arm 22 includes an error that cannot be corrected by the geometry adjustment and the calibration, control device 70 can move arm 22 to the target position more accurately without being affected by the error.

Further, in the present embodiment, the geometry adjustment is performed before the matrix measurement/correction. Therefore, robot 20 can further enhance the positional precision by a combination of the geometry adjustment and the matrix measurement/correction. In addition, in the present embodiment, by executing the geometry adjustment before the matrix measurement/correction, it is possible to obtain the correction value with the precision necessary in the entire work area without setting the pitch excessively finely in the matrix measurement.

Further, in the present embodiment, the calibration is performed before matrix measurement/correction. Therefore, robot 20 can correctly grasp the relative positional relation with workbench 11, and can further enhance the positional precision. In addition, in the present embodiment, by executing the calibration before the matrix measurement/correction, it is possible to obtain the correction value with the precision necessary in the entire work area without setting the pitch excessively finely in the matrix measurement.

It is needless to say that the present disclosure is not limited in any way to the above described embodiments, and any embodiment may be implemented in various forms as long as it belongs to the technical scope of the present disclosure.

For example, in the above described embodiment, the assembly adjustment, the geometry adjustment, and the calibration are executed in addition to the matrix measurement/correction; however, some or all of these may be omitted. Further, in the above described embodiment, the calibration is executed after the geometry adjustment; however, the calibration may be executed before the geometry adjustment.

Further, in the above described embodiment, CPU 71 sets the multiple work points so as to be arranged in a matrix at a predetermined pitch in the matrix measurement; however, CPU 71 may set the multiple work points according to other rules.

Further, in the above described embodiment, robot 20 has the joints of five axes; however, robot 20 may have the joints of four axes or less, or may have the joints of six axes or more. Further, robot 20 has only the rotation•pivot joint; however, robot 20 may have a linear movement joint.

As described above, the work position correction method of the present disclosure is a work position correction method for operating a multi joint type work robot by designating a target position, the method including: setting multiple work points in a movable area of the work robot; setting a correction parameter in which a spatial coordinate value and a correction value are associated with respect to the set multiple work points; and reflecting the set correction parameter on the target position.

The work position correction method of the present disclosure may further include setting the multiple work points to be arranged in a matrix at a predetermined pitch. According to the present disclosure, by appropriately setting the pitch between adjacent work points, it is possible to easily secure the necessary work precision.

The work position correction method of the present disclosure may further include: performing a matrix measurement by setting the multiple work points, sequentially designating each spatial coordinate value of the set multiple work points to the target position, moving the work robot, and measuring an actual position of the work robot at each work point so as to derive a difference between the spatial coordinate value of each work point and the measured actual position; and performing a matrix correction by deriving a correction value for each work point based on the derived difference, associating the spatial coordinate value and the derived correction value for each work point, and setting the correction parameter so as to reflect the set correction parameter on the target position. According to the work position correction method of the present disclosure, the more accurate correction value can be derived for each work point.

The work position correction method of the present disclosure may further include interpolating the correction value between the adjacent work points. According to the work position correction method of the present disclosure, even in a case where the target position is designated at a position deviated from the set work point, it is possible to secure the necessary positional precision.

The work position correction method of the present disclosure may further include performing a geometry adjustment of adjusting a conversion parameter used for a coordinate transformation of the target position before the matrix measurement. According to the work position correction method of the present disclosure, the work precision can be further enhanced by a combination of the matrix correction and the geometry adjustment. Further, according to the work position correction method of the present disclosure, since the geometry adjustment is executed before the matrix measurement, it is possible to secure the necessary positional precision without increasing the number of work points necessary for the matrix measurement.

The work position correction method of the present disclosure may further include: performing a calibration, before the matrix measurement, by specifying a relative positional relation between a workbench on which a work object to be worked by the work robot is put and the work robot so as to reflect the relative positional relation on the target position. According to the work position correction method of the present disclosure, the work precision can be further enhanced by the combination of the matrix measurement, the geometry adjustment, and the calibration. Further, according to the work position correction method of the present disclosure, since the calibration is executed before the matrix measurement, it is possible to secure the necessary positional precision without increasing the number of the work points necessary for the matrix measurement.

INDUSTRIAL APPLICABILITY

The present disclosure can be used for a manufacturing industry of a work robot and the like.

REFERENCE SIGNS LIST

10 Robot system, 11 workbench, 12 board conveyance device, 13 component supply device, 14 parts camera, 20 robot, 22 arm, 24 mark camera, 31 to 36 first to sixth links, 41 to 45 first to fifth joints, 51 to 55 first to fifth motors, 61 to 65 first to fifth encoders, 70 control device, 71 CPU, 72 ROM, 73 HDD, 74 RAM, 75 drive circuit, 76 input device, 77 output device, 100 three-dimensional measurement instrument, m marker, M mark, S board.

The invention claimed is:

1. A work position correction method for operating a multi-joint type work robot by designating a target position, the method comprising:
   performing a matrix measurement by setting multiple work points in a movable area of the work robot, the set multiple work points arranged three-dimensionally in a matrix at a predetermined distance; sequentially designating each spatial coordinate value of the set multiple work points to the target position; driving the work robot according to the set multiple work points; and measuring an actual position of the work robot at each of the work points so as to derive a difference between the spatial coordinate value of each of the work points and the measured actual position; and
   performing a matrix correction by deriving a correction value for each of the work points based on the derived difference; associating the spatial coordinate value and the derived correction value for each of the work points; and setting a correction parameter based upon the associated spatial coordinate value and derived correction value with respect to the set multiple work points so as to reflect the set correction parameter on the target position,
   wherein the matrix measurement and the matrix correction form the last step in a plurality of distinct work position correction steps.

2. The work position correction method according to claim 1, further comprising: interpolating a correction value between adjacent work points.

3. The work position correction method according to claim 1, further comprising: performing a geometry adjustment of adjusting a conversion parameter used for a coordinate transformation of the target position before the matrix measurement.

4. The work position correction method according to claim 1, further comprising: performing a calibration, before the matrix measurement, by specifying a relative positional relation between a workbench on which a work object to be worked by the work robot is put and the work robot so as to reflect the relative positional relation on the target position.

5. The work position correction method according to claim 1, wherein a number of the plurality of distinct work position correction steps is more than two.

6. The work position correction method according to claim 1, wherein the matrix measurement and matrix correction are executed in a state in which a positional precision of the work robot is enhanced by execution of a geometry adjustment and a calibration.

7. The work position correction method according to claim 1, wherein the driving the work robot includes controlling the work robot such that a marker disposed on a distal link of the work robot moves to the multiple work points.

8. A work robot comprising:
a multi-joint type robot arm;
an actuator configured to drive each joint of the robot arm;
a storage device configured to store a correction parameter; and
a control device configured to correct a target position using the correction parameter stored in the storage device and to control the actuator based on the corrected target position, wherein
the correction parameter was set by a processor, of the control device, configured to:
perform a matrix measurement by setting multiple work points in a movable area of the work robot, the set multiple work points arranged three-dimensionally in a matrix at a predetermined distance; sequentially designating each spatial coordinate value of the set multiple work points to the target position; driving the work robot according to the set multiple work points; and measuring an actual position of the work robot at each of the work points so as to derive a difference between the spatial coordinate value of each of the work points and the measured actual position; and
perform a matrix correction by deriving a correction value for each of the work points based on the derived difference; associating the spatial coordinate value and the derived correction value for each of the work points; and setting the correction parameter based upon the associated spatial coordinate value and derived correction value with respect to the set multiple work points so as to reflect the set correction parameter on the target position, and
the matrix measurement and the matrix correction form the last step in a plurality of distinct work position correction steps.

9. The work position correction method according to claim 3, further comprising: performing a calibration, before the matrix measurement, by specifying a relative positional relation between a workbench on which a work object to be worked by the work robot is put and the work robot so as to reflect the relative positional relation on the target position.

10. The work position correction method according to claim 4, wherein the relative positional relation is determined based upon recognition of a mark on the work object.

11. The work position correction method according to claim 9, wherein the relative positional relation is determined based upon recognition of a mark on the work object.

12. The work position correction method according to claim 9, further comprising: performing an assembly adjustment, before the matrix measurement, by adjusting an assembly angle of a link of the work robot.

* * * * *